United States Patent
Schoepp et al.

(10) Patent No.: US 6,361,645 B1
(45) Date of Patent: Mar. 26, 2002

(54) METHOD AND DEVICE FOR COMPENSATING WAFER BIAS IN A PLASMA PROCESSING CHAMBER

(75) Inventors: Alan M. Schoepp, Ben Lomond; Robert E. Knop, Fremont; Christopher H. Olson, El Dorado; Michael S. Barnes, San Ramon; Tuan M. Ngo, Milpitas, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/169,017

(22) Filed: Oct. 8, 1998

(51) Int. Cl.[7] ............................................. H02N 13/00
(52) U.S. Cl. .................. 156/345; 118/723 E; 118/728; 118/500; 204/298.03; 204/298.08; 204/298.32; 204/298.34; 361/234; 323/234; 323/304; 323/318; 324/109
(58) Field of Search ................................. 118/500, 728, 118/723 E; 204/298.31–298.34, 298.03, 298.08; 279/126, 128; 323/312–313, 304, 318, 234; 324/109; 361/6, 234; 156/345

(56) References Cited

U.S. PATENT DOCUMENTS

| | | | |
|---|---|---|---|
| 3,941,966 A | 3/1976 | Schatz | 219/10.49 |
| 5,187,454 A | 2/1993 | Collins et al. | 333/17.3 |
| 5,463,526 A | 10/1995 | Mundt | 361/234 |
| 5,557,215 A | 9/1996 | Saeki et al. | 324/765 |
| 5,609,720 A | 3/1997 | Lenz et al. | 156/643.1 |
| 5,670,066 A | 9/1997 | Barnes et al. | 219/121.58 |
| 5,671,116 A | 9/1997 | Husain | 361/234 |
| 5,689,215 A | 11/1997 | Richardson et al. | 333/17.3 |
| 5,708,250 A | 1/1998 | Benjamin et al. | 219/121.58 |
| 5,737,175 A | 4/1998 | Grosshart et al. | 361/234 |
| 5,793,162 A | 8/1998 | Barnes et al. | 315/111.21 |
| 5,793,192 A | 8/1998 | Kubly et al. | 323/312 |
| 5,798,904 A | 8/1998 | Guyot | 361/234 |
| 5,835,333 A | 11/1998 | Castro et al. | 361/234 |
| 5,933,314 A | 8/1999 | Lambson et al. | 361/234 |

FOREIGN PATENT DOCUMENTS

| | | | |
|---|---|---|---|
| EP | 0439000 A1 | 7/1991 | H02N/13/00 |
| EP | 0837500 A2 | 4/1998 | H01L/21/68 |
| WO | WO 97/37382 | 10/1997 | H01L/21/68 |
| WO | WO 98/00861 | 1/1998 | H01L/21/68 |
| WO | WO 98/43291 | 10/1998 | H01L/21/68 |
| WO | WO 99/52144 | 10/1999 | H01L/21/68 |

OTHER PUBLICATIONS

M. Lieberman and A. Lichtenberg, "Principles of Plasma Discharges and Materials Processing", © 1994, Wiley–Interscience Publ., John Wiley & Sons, Inc.

*Primary Examiner*—Richard Bueker
(74) *Attorney, Agent, or Firm*—Martine & Penilla, LLP

(57) ABSTRACT

Disclosed is a method and device for compensating a bias voltage on a wafer disposed over an electrostatic chuck in a processing chamber of a plasma processing system. The plasma processing system includes an electrostatic and RF power supplies that are coupled to the electrostatic chuck. The bias compensation device includes a voltage converter, a storage unit, and a voltage adjusting circuitry. The voltage converter is coupled to the electrostatic chuck for detecting a voltage Vpp of the electrostatic chuck. The voltage converter converts the detected voltage to a lower voltage Vref. The storage unit stores a predetermined slope and a predetermined offset of a calibration curve, which is derived by fitting a plurality of wafer bias voltages as a function of electrostatic chuck voltages.

32 Claims, 8 Drawing Sheets

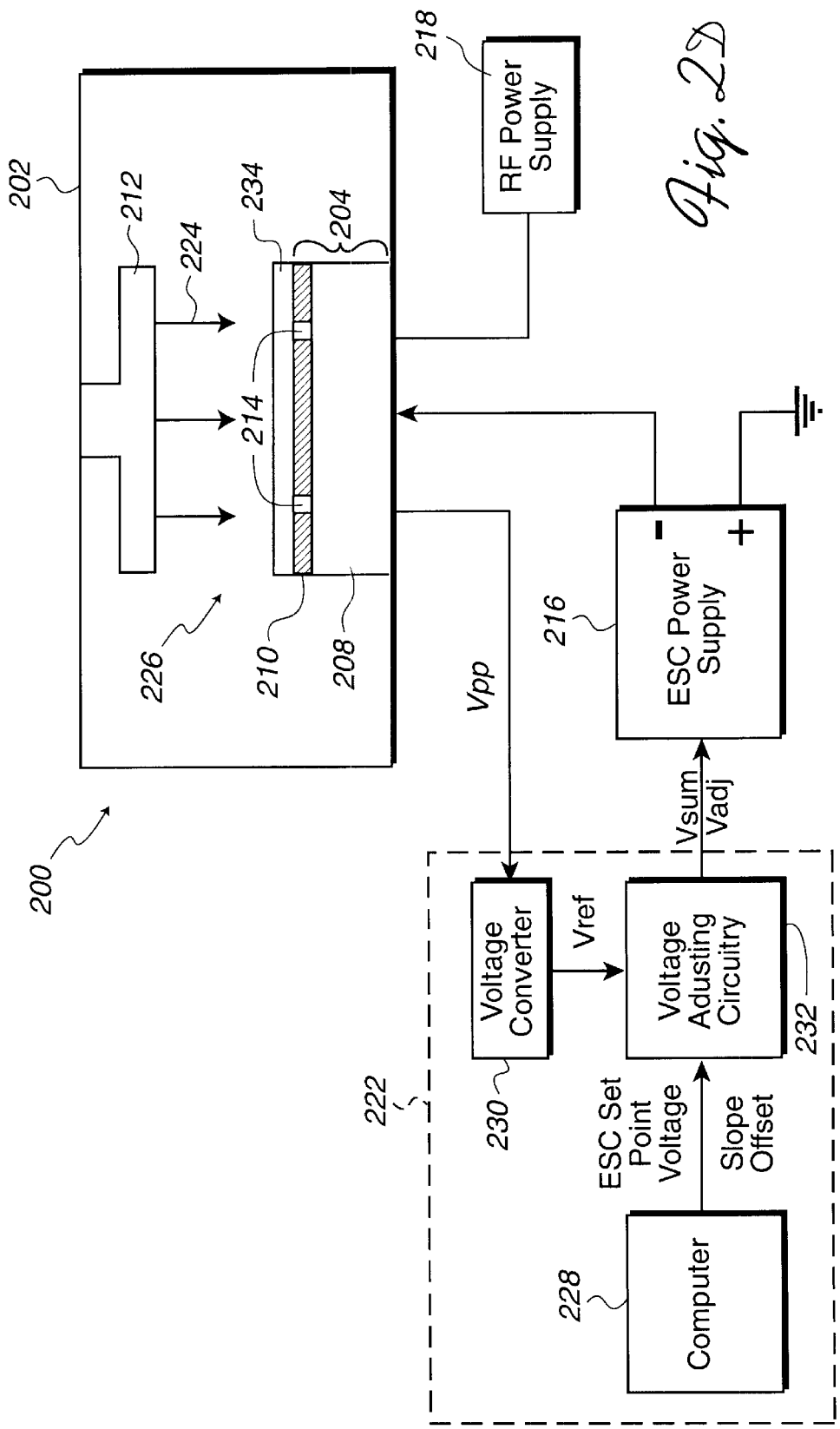

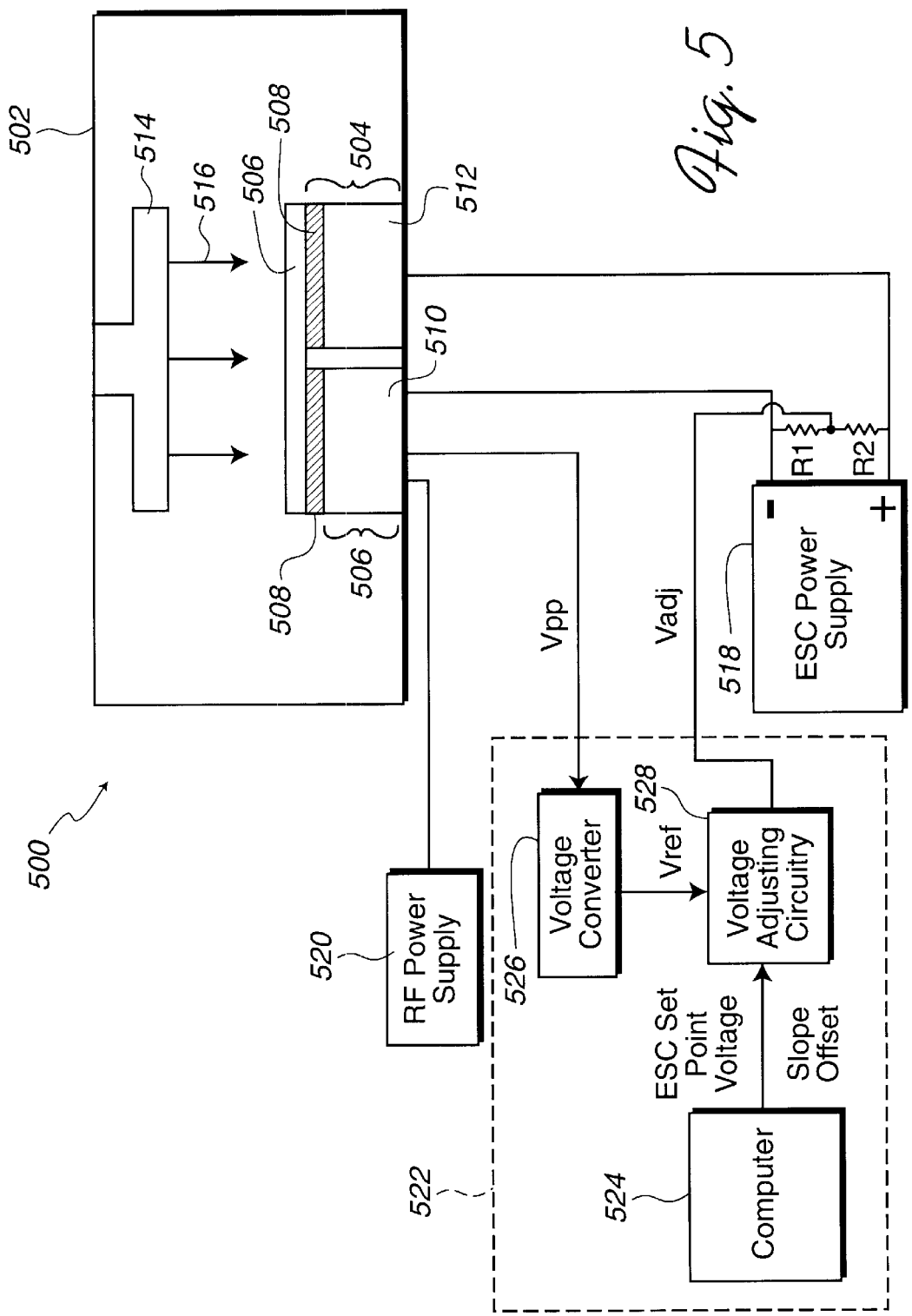

METHOD AND DEVICE FOR COMPENSATING WAFER BIAS IN A PLASMA PROCESSING CHAMBER

BACKGROUND OF THE INVENTION

1. Field of the Invention

The present invention relates to the manufacture of semiconductor devices. More specifically, the present invention relates to improved methods and apparatus for electrostatically clamping a semiconductor wafer on an electrostatic chuck in a processing chamber of a semiconductor wafer processing system.

2. Description of the Related Art

Semiconductor processing systems are generally used to process semiconductor wafers for fabrication of integrated circuits. For example, plasma-enhanced semiconductor processes are commonly used in etching, oxidation, chemical vapor deposition (CVD). The plasma-enhanced semiconductor processes are typically carried out by means of plasma processing systems and generally include a plasma processing chamber to provide a controlled setting.

Conventional plasma processing chambers often include electrostatic chucks to hold a wafer (e.g., silicon wafer or substrate) in place for processing. Electrostatic chucks utilize electrostatic force to clamp the wafer to the chuck. Electrostatic chucks are well known in the art and are amply described, for example, in commonly owned U.S. Pat. No. 5,789,904 by Francois Guyot and entitled "High Power Electrostatic Chuck Contact," which is incorporated herein by reference.

Electrostatic chucks can be classified into monopolar and bipolar electrostatic chucks. Monopolar electrostatic chucks have a single pole whereas the bipolar electrostatic chucks have two poles. FIG. 1A illustrates an exemplary plasma processing system 100 that includes a monopolar electrostatic chuck (ESC) 104. The plasma processing system 100 includes a plasma processing chamber 102, a radio frequency (RF) power supply 118, and an ESC power supply 116. Disposed within the plasma processing chamber 102 are a shower head 110, the ESC 104, and a semiconductor wafer 106 disposed over the ESC 104. The shower head 110 is typically used to release source gases 112 into a plasma region 120 of plasma processing chamber 102 and may be made of a non-conductive material such as quartz.

When the RF power supply 118 is energized, a plasma is created within plasma region 120 out of the source gases. The wafer 106 is disposed over the electrostatic chuck 104 to be processed by the plasma. The electrostatic chuck 104 includes a dielectric layer 108 disposed over a metal layer 109. The metal layer 109 serves as an electrostatic pole (i.e., electrode) and is negatively biased in the monopolar ESC configuration of FIG. 1. A heat transfer gas (e.g., helium) is provided under pressure via a port 114 between the electrostatic chuck 104 and the wafer 106. The gas acts as a heat transfer medium between the wafer 106 and electrostatic chuck 104 to facilitate control of the wafer temperature during processing.

To securely clamp the wafer 106 to the electrostatic chuck 104 during processing, the ESC power supply 116 is activated. When the plasma is generated in the plasma region 120, the plasma essentially functions as a resistor coupled between the wafer 106 and ground. In this configuration, the ESC pole is biased with the negative direct current potential. The direct current potential in the electrostatic pole creates a potential difference between the top surface of the pole and the bottom surface of the wafer, thereby generating an electrostatic force to hold the wafer 106 in place with respect to the electrostatic chuck 104. Electrostatic chucks are well known in the art and are described in detail in the following references, which are incorporated herein by reference: U.S. patent application Ser. No. 08/624,988 by Jones et al. and entitled "Dynamic Feedback Electrostatic Wafer Chuck," and U.S. patent application Ser. No. 08/550,510 by Castro et al.

FIG. 1B illustrates the plasma processing system 100 that includes a bipolar electrostatic chuck 150 instead of the monopolar electrostatic chuck. The bipolar electrostatic chuck 150 has a pair of metal portions 152 and 154. The metal portion 152 is coupled to a negative terminal of the ESC power supply 116 while the metal portion 154 is coupled to a positive terminal of the ESC power supply 116. These metal portions 152 and 154 function as a pair of electrodes with a negative pole and a positive pole, respectively. The RF power supply 118 is coupled to the electrostatic chuck 150 to excite the plasma. Disposed on top of the metal portions is a dielectric layer 156. A feed-tube 158 is formed through the electrostatic chuck 150 to supply a cooling gas (e.g., helium) to the wafer 106 during processing.

When the ESC and RF power supplies are activated along with the shower head 110 to release plasma into the plasma region, a positive potential and a negative potential are induced on the positive and negative poles, respectively, thereby generating an electrostatic forces between the poles and the respective overlaying wafer regions. The electrostatic forces holds the wafer 106 in place with respect to the electrostatic chuck 150 during processing.

Unfortunately, the wafer 106 typically develops a self-bias voltage during the operation of the plasma processing system 100 in both the monopolar and bipolar ESC arrangements. By way of example, if the ESC power supply supplies −200 volt (V) to the electrostatic chuck 104 in the monopolar ESC configuration with the RF power activated, the wafer 106 may develop a self-bias voltage of −100 V. This means that the effective clamping force is only 100 V, thereby leading to inefficient clamping of the wafer 106.

One of the traditional techniques compensates for the self-bias voltage of the wafers by using silicon carbide resistors connected with the plasma to balance the self-bias voltage of the wafer. Unfortunately, this solution is highly application specific in that it works only in a specified chemistry, process, and/or chamber.

Another conventional technique estimates a bias voltage of a wafer beforehand and compensates for the bias during the plasma process based on the estimated bias voltage. For example, assuming a desired clamping voltage of 500 volts, if a bias voltage of a wafer is estimated to be 300 volts, the setpoint voltage of ESC power supply was set to 800 volts to generate the desired 500 volts. This solution, however, does not provide optimum compensation since bias voltage of a wafer may change from one moment to another due to changes in the process parameters.

Another problem associated with conventional compensation techniques is the potential damage to electrostatic chucks due to typically high setpoint voltages supplied by ESC power supplies. For example, if the RF power supply doesn't activate in time, the high setpoint voltages from the ESC power supplies may seriously damage the electrostatic chucks.

Furthermore, a bias voltage of a wafer is difficult to measure directly during plasma processing in the chamber due to the difficulty of establishing an electrical contact to the wafer via a voltage and/or current probe during the plasma processing. In addition, such an electrical contact may be undesirable because the additional electrical contacts may affect the sensitive plasma process in the chamber.

In view of the foregoing, what is needed are devices and methods for efficiently compensating for the self-bias of wafers during plasma processing without a direct contact to the wafers. What is further needed is apparatus and method that can dynamically compensate for the changes in self-bias of wafers without damaging the electrostatic chucks.

SUMMARY OF THE INVENTION

Broadly speaking, the present invention fills these needs by providing a device, method, and system for compensating a wafer bias voltage in a plasma processing chamber. It should be appreciated that the present invention can be implemented in numerous ways, including as a process, an apparatus, a system, a device, a method, or a computer readable medium. Several inventive embodiments of the present invention are described below.

In accordance with one embodiment, the present invention provides a bias compensation device for compensating a bias voltage on a wafer disposed over an electrostatic chuck in a processing chamber of a plasma processing system. The plasma processing system includes an electrostatic and RF power supplies that are coupled to the electrostatic chuck. The bias compensation device includes a voltage converter, a storage unit, and a voltage adjusting circuitry. The voltage converter is coupled to the electrostatic chuck for detecting a voltage Vpp of the electrostatic chuck. The voltage converter converts the detected voltage to a lower voltage Vref. The storage unit stores a predetermined slope and a predetermined offset of a calibration curve, which is derived by fitting a plurality of wafer bias voltages as a function of electrostatic chuck voltages.

The voltage adjusting circuitry is coupled to receive Vref from the voltage converter and is coupled to receive the slope and the offset from the storage unit such that the voltage adjusting circuitry modifies Vref by the slope and the offset to compensate for the bias voltage. The voltage adjusting circuitry transmits the modified Vref to the electrostatic chuck power supply, which converts the modified Vref into a bias compensated voltage for input to the electrostatic chuck.

In another embodiment, the present invention provides a plasma processing system for compensating a bias voltage on a wafer. The system includes a plasma processing chamber, an electrostatic power supply, an RF power supply, and a bias compensation device. The plasma processing chamber includes an electrostatic chuck and a shower head. The electrostatic chuck has a dielectric layer disposed over a metal layer and is capable of supporting a wafer. The shower head is capable of releasing a gas into the chamber. The electrostatic power supply is coupled to the electrostatic chuck for providing a high DC voltage to the electrostatic chuck. The RF power supply is coupled to the electrostatic chuck for providing an RF voltage signal to the electrostatic chuck.

The bias voltage compensation device is coupled between the metal portion of the electrostatic chuck and the electrostatic power supply to detect a voltage Vpp of the metal portion to generate a lower voltage Vref. The bias voltage compensation device adjusts Vref to generate an adjusted voltage Vadj using a calibration curve derived by fitting a plurality of wafer bias voltages as a function of electrostatic chuck voltages. The electrostatic power supply receives the adjusted voltage Vadj and converts the adjusted voltage Vadj into a bias compensated voltage for input to the electrostatic chuck power supply.

In accordance with another embodiment, the present invention provides a method for compensating a bias voltage on a wafer disposed in place over an electrostatic chuck in a processing chamber of a plasma processing system. The plasma processing system includes an electrostatic and RF power supplies that are coupled to the electrostatic chuck. The method includes: (a) determining a slope and an offset of a calibration curve, which is derived by fitting a plurality of wafer bias voltages as a function of electrostatic chuck voltages; (b) detecting a voltage Vpp of the electrostatic chuck; (c) converting the detected voltage to a lower voltage Vref; (d) modifying Vref by the slope and the offset to compensate for the bias voltage; and (e) converting the modified Vref into a bias compensated voltage for input to the electrostatic chuck.

In accordance with yet another embodiment, the present invention provides a bias compensation device for compensating a bias voltage on a wafer disposed in place over an electrostatic chuck in a processing chamber of a plasma processing system. The plasma processing system includes an electrostatic and RF power supplies that are coupled to the electrostatic chuck. The bias compensation device includes: (a) means for determining a slope and an offset of a calibration curve, which is derived by fitting a plurality of wafer bias voltages as a function of electrostatic chuck voltages; (b) means for detecting a voltage Vpp of the electrostatic chuck; (c) means for converting the detected voltage to a lower voltage Vref; (d) means for modifying Vref by the slope and the offset to compensate for the bias voltage; and (e) means for converting the modified Vref into a bias compensated voltage for input to the electrostatic chuck.

Advantageously, the present invention provides devices, method, and system for efficiently compensating for self-bias of wafers placed over an electrostatic chuck for plasma processing without directly measuring the self-bias of the wafers. Instead, the present invention correlates the bias voltages of a sample wafer to the electrostatic chuck voltages to generate a calibration curve. A slope and an offset generated from the calibration curve is used to modify supply voltage to the electrostatic chuck, thereby compensating for a wafer bias without contacting the wafer during processing. This allows dynamic compensation of wafer bias voltages, which may vary during the process without damaging the electrostatic chuck. These and other advantages of the present invention will become apparent upon reading the following detailed descriptions and studying the various figures of the drawings.

BRIEF DESCRIPTION OF THE DRAWINGS

The present invention will be readily understood by the following detailed description in conjunction with the accompanying drawings, and like reference numerals designate like structural elements.

FIG. 2D illustrates, in accordance with one embodiment of the present invention, the plasma processing system coupled to a bias compensation device for dynamically compensating for a self-bias of a semiconductor wafer.

FIG. 5 shows a plasma processing system having a bipolar electrostatic chuck in accordance with one embodiment of the present invention.

DETAILED DESCRIPTION OF THE PREFERRED EMBODIMENTS

An invention is described herein for device, method, and system for compensating a wafer bias voltage in a plasma processing chamber. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

The present invention compensates for self-bias voltage (Vdc) of a wafer by first generating a calibration curve that plots Vdc as a function of the peak-to-peak voltage (Vpp) of an electrostatic chuck electrode. From the calibration curve, a slope and an offset voltage are determined. The slope and the offset voltage are then used to adjust ESC setpoint voltage that is supplied to the electrostatic chuck. In this manner, the self-bias voltage of a wafer is dynamically compensated without directly measuring Vdc.

Figure 1A:
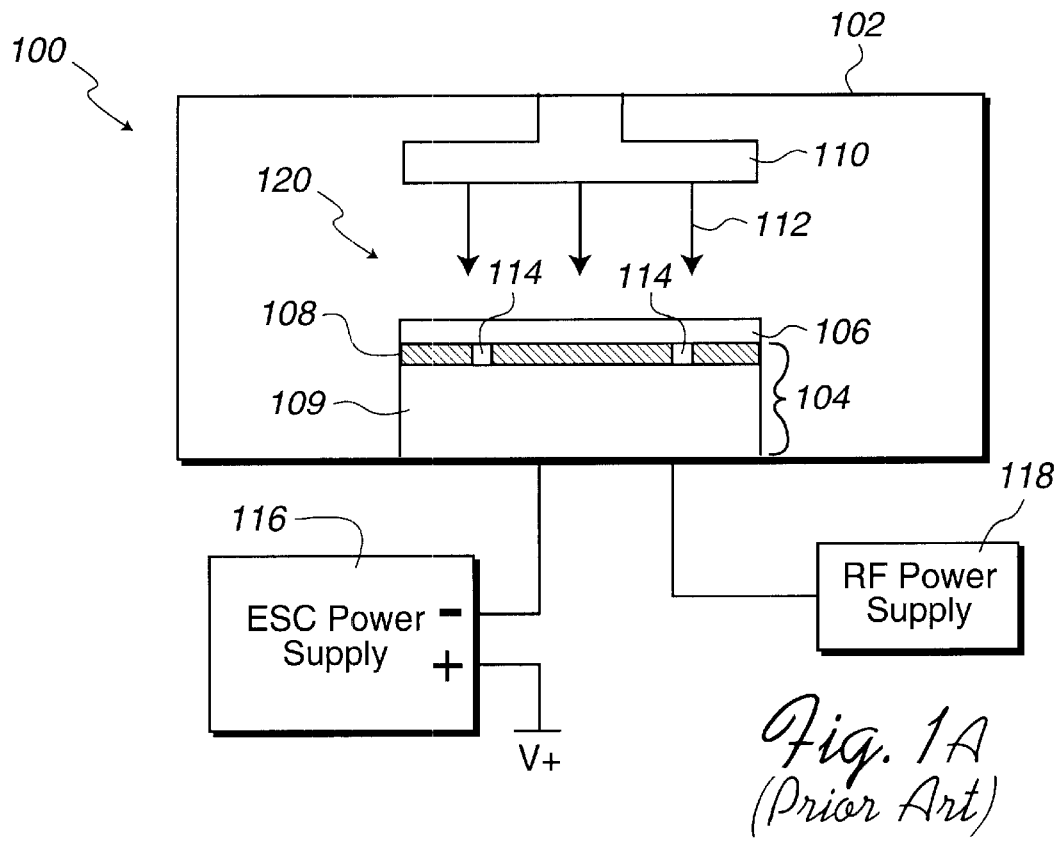
FIG. 1A illustrates an exemplary plasma processing system that includes a monopolar electrostatic chuck.
Figure 1B:
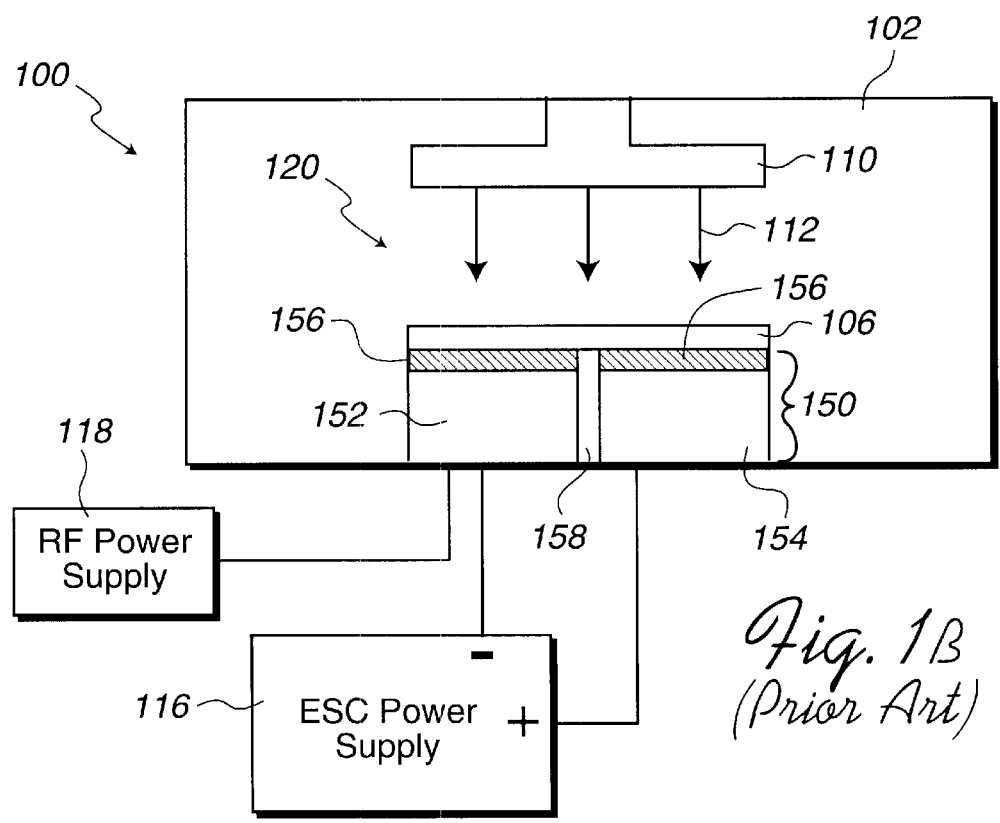
FIG. 1B illustrates the plasma processing system that includes a bipolar electrostatic chuck instead of the monopolar electrostatic chuck.
Figure 2A:
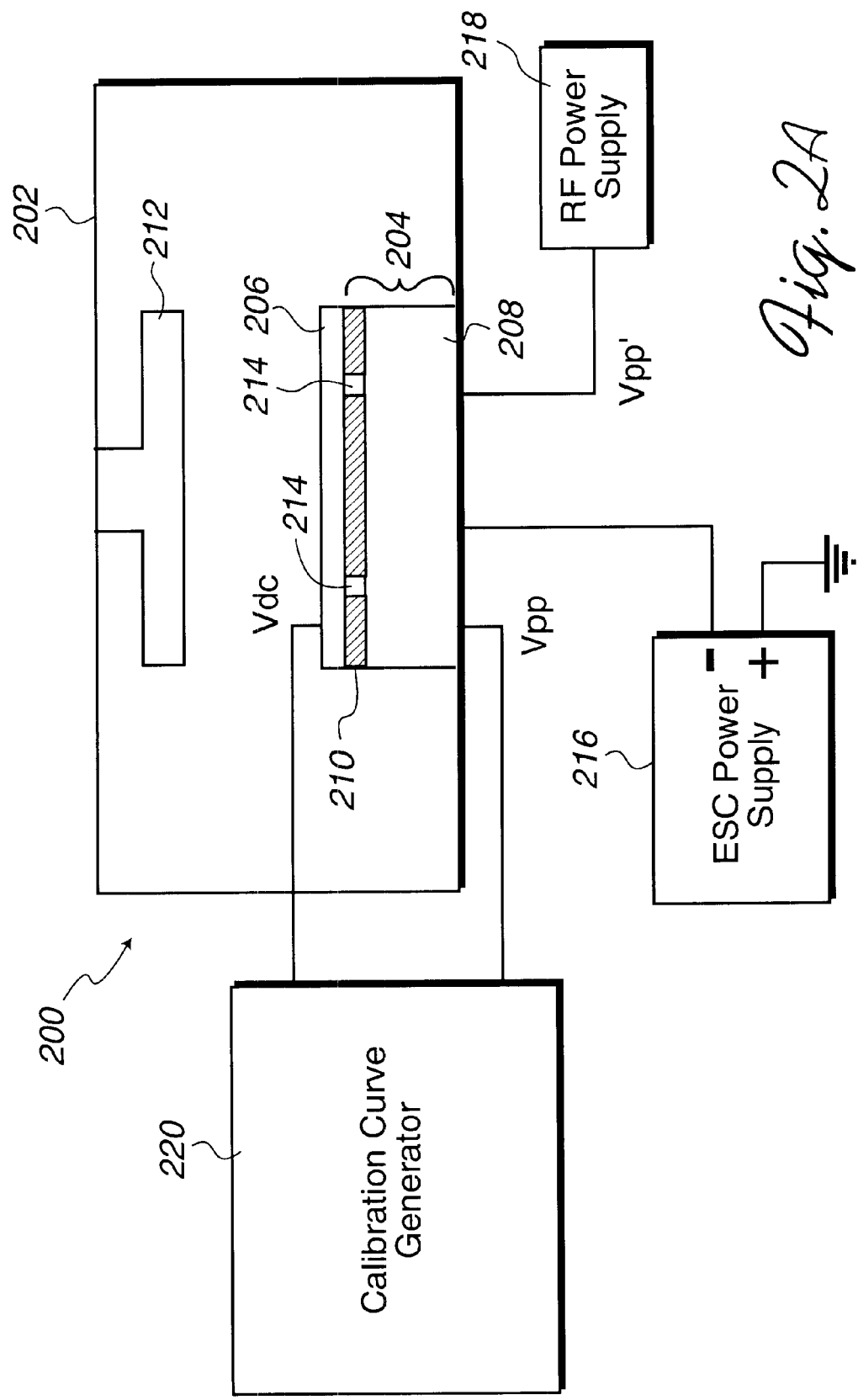
FIG. 2A illustrates a plasma processing system coupled to a calibration curve generator for generating a calibration curve in accordance with one embodiment of the present invention.

FIG. 2A illustrates a plasma processing system 200 coupled to a calibration curve generator 220 for generating a calibration curve in accordance with one embodiment of the present invention. The plasma processing system 200 includes a plasma processing chamber 202, an ESC power supply 216, an RF power supply 218. The plasma processing chamber 202 further includes a shower head 212, an electrostatic chuck 204, and a semiconductor wafer 206. The ESC power supply 216 delivers a DC voltage while the RF power supply 218 delivers a radio frequency signal having a peak-to-peak voltage Vpp'. The chamber 202 remains in a vacuum condition during the calibration process. It should be borne in mind that although the plasma processing system 200 is described in detail herein to facilitate understanding of the advantages of the present invention, the invention itself is not limited to any particular type of wafer processing apparatus and may be adapted for use in any of the known wafer processing systems, including but not limited to those adapted for deposition, oxidation, etching (including dry etching, plasma etching, reactive ion etching (RIE), magnetically enhanced reactive ion etching (MERIE), electron cyclotron resonance (ECR)), or the like.

The electrostatic chuck 204 includes a dielectric layer 210 formed over a metal layer 208 in a monopolar arrangement. The metal layer 208 functions as an electrode and is coupled to the ESC and RF power supplies 216 and 218. The ESC power supply 216 is preferably a high power device capable of delivering from 0 to −2,000 volts.

The wafer is disposed over the electrostatic chuck 204 and may be any suitable semiconductor wafers or substrates. One or more feed-tubes 214 are through one or more portions of the electrostatic chuck 204 to supply a cooling gas such as helium. Even though a monopolar electrostatic chuck is illustrated in FIG. 2A, it should be borne in mind that the calibration curve generator 220 can also be used with other monopolar and bipolar electrostatic chucks.

The calibration curve generator 220 is coupled to the wafer 206 to measure a self-bias voltage Vdc of the wafer 206. Preferably, the wafer bias voltage is measured at the top surface of the wafer. The calibration curve generator 220 is also coupled to the metal layer 208 to measure a peak-to-peak voltage Vpp of the electrode.

Figure 2B:
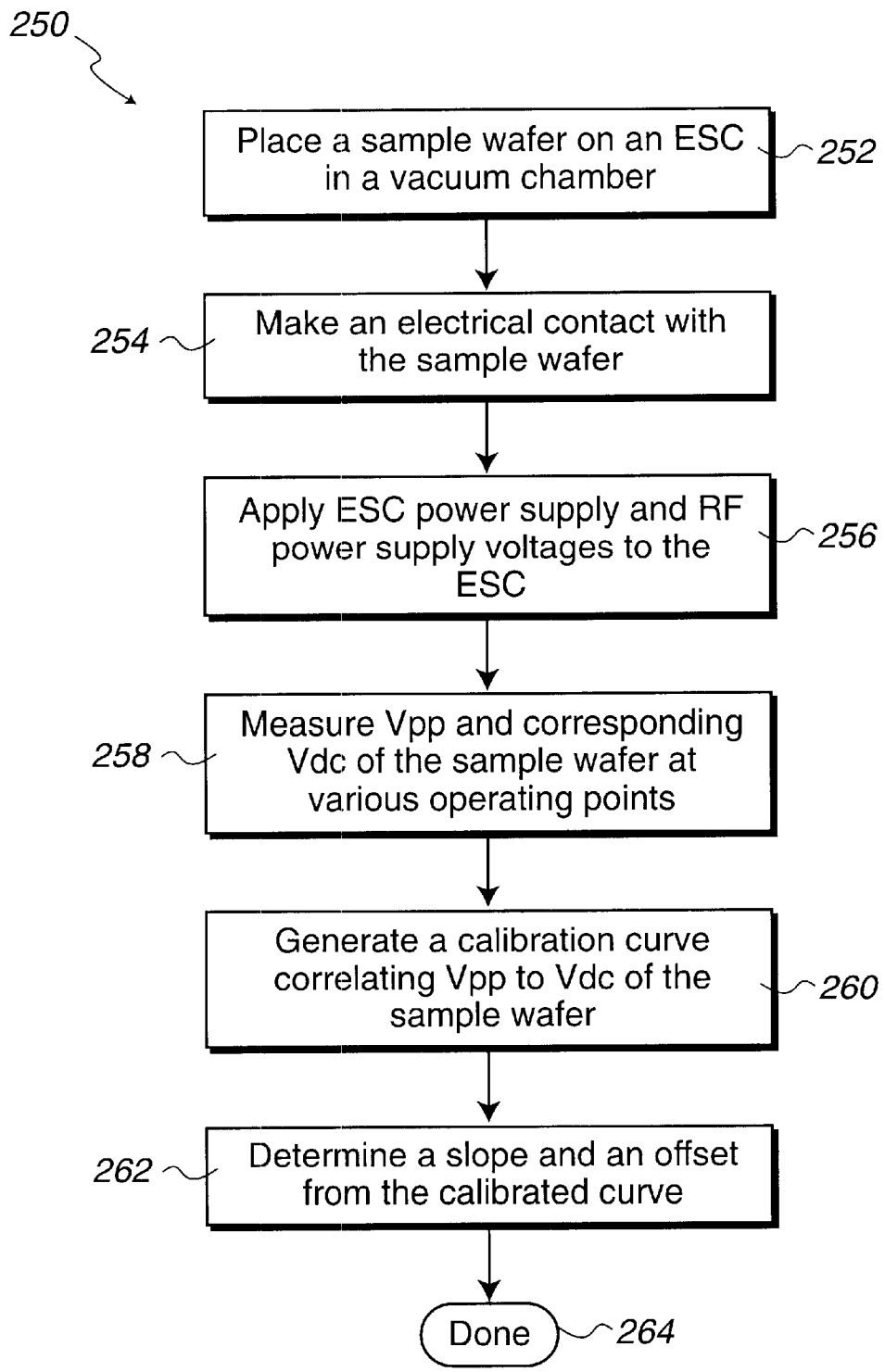
FIG. 2B shows a flow chart of a method involved in generating a calibration curve in accordance with one embodiment of the present invention.

FIG. 2B shows a flow chart of a method 250 involved in generating a calibration curve in accordance with one embodiment of the present invention. In operation 252, a sample wafer is placed on the electrostatic chuck 204 in the vacuum chamber 202 for testing. Then in operation 254, the calibration curve generator 220 is electrically coupled to the sample wafer and the electrode of the ESC. To activate testing process, the ESC and RF power supplies 216 and 218 are turned on. The ESC power supply 216 delivers a setpoint voltage to the electrode and the RF power supply 218 delivers a RF signal to the electrode. Preferably, the RF signal is in the range between 60 Hz to 50 MHz.

When the ESC and RF power supplies 216 and 218 are activated, the calibration curve generator 220 measures a plurality of bias voltages (Vdc) of the test wafer and corresponding peak-to-peak voltages (Vpp) of the ESC electrode in operation 258. The measurement of Vdc and associated Vpp can be performed at various operating conditions. For example, the voltage from the RF power supply 218 can be varied to produce different values of Vdc and Vpp.

After obtaining a plurality of Vdc and Vpp measurements, the sample points of Vdc and associated Vpp are plotted and fitted to generate a calibration curve in operation 260. The calibration curve correlates Vpp to Vdc. Preferably, the values of Vdc and Vpp are fitted to generate a linear calibration curve. Then in operation 262, a slope and an offset voltage are determined from the generated calibration curve. The method terminates in operation 264.

Figure 2C:
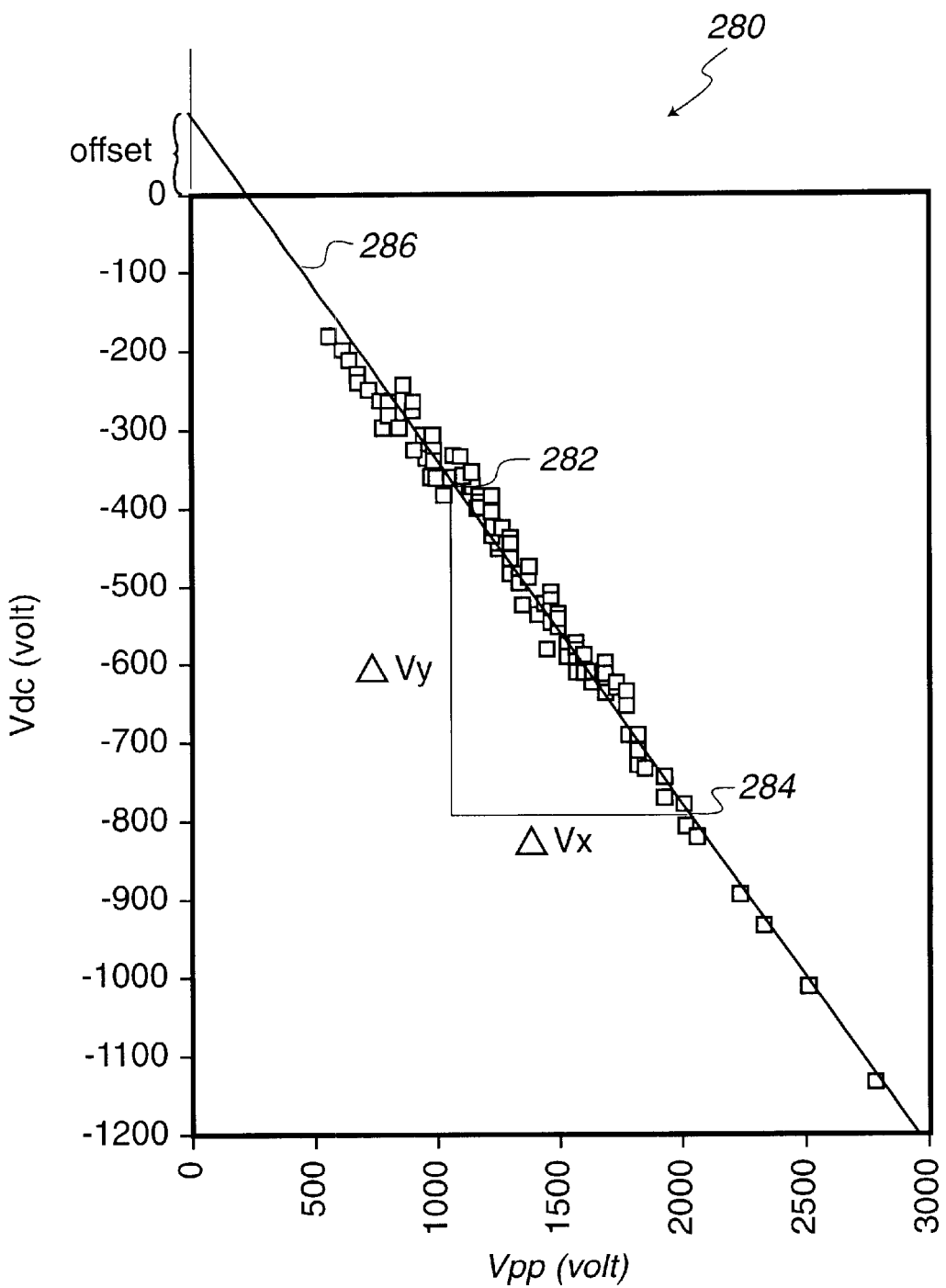
FIG. 2C illustrates an exemplary graph plotting the sample points of Vdc and Vpp to generate a linear curve, its slope and offset.

FIG. 2C illustrates a graph 280 plotting the sample points of Vdc and Vpp to generate a linear curve, its slope and offset in accordance with one embodiment of the present invention. The sample points are indicated as square blocks. The sample points are plotted with the Vpp as the x-axis and Vdc as y-axis. Then, using well known curve fitting techniques, the calibration curve 286 is generated from the sample points.

From the calibrated curve, the offset and slope are determined. Specifically, the offset voltage is computed by determining the intersection of the calibration curve with the y-axis plotting Vdc values. The voltage at the intersection is the offset voltage. On the other hand, the slope of the calibration curve can be determined by any well known slope determining techniques. For example, the slope of the calibration curve is computed by selecting a pair of points 282 and 284 on the calibration curve and dividing the difference between the Vcc values ($\Delta$Vy) by the difference between the Vpp values ($\Delta$Vx) of the selected points. As will be described below, the slope and offset voltage thus determined are used to compensate for the self-bias of a wafer during plasma processing of a wafer in the chamber 202.

After determining the offset and slope from the calibration curve, the plasma processing system 200 uses the offset and slope to compensate for the self-bias of a wafer during plasma processing of a wafer. FIG. 2D illustrates, in accordance with one embodiment of the present invention, the plasma processing system 200 coupled to a bias compensation device 222 for dynamically compensating for a self-bias of a semiconductor wafer 234. The semiconductor wafer 234 is placed over the electrostatic chuck 204 for processing. It should be noted that the offset and the slope derived from the calibration curve may be used to compensate for self-bias of any suitable semiconductor wafer or substrate in the chamber 202.

The bias compensation device 222 is coupled between the electrode 208 of the electrostatic chuck 204 and the ESC power supply 216 to form a feedback loop. The bias compensation device 222 includes a computer 228, a voltage converter 230, and a voltage adjusting circuitry 232. The voltage converter 230 is coupled to the ESC electrode 208 and detects a peak-to-peak voltage Vpp from the ESC electrode 208. Since the electrostatic chuck 204 receives high voltages (e.g., −1,000 V), the voltage converter 230 reduces the detected Vpp into a lower voltage, Vref, by converting the Vpp. The voltage converter 230 may be implemented as a voltage divider circuit or other suitable circuits that can convert a high voltage into a lower voltage. Preferably, the voltage converter 230 converts Vpp into Vref that is in a range between 0 to −10 V. The voltage converter 230 is coupled to transmit Vref to the voltage adjusting cirucitry 232, which adjusts Vref based on the slope and offset from the computer 228.

The computer 228 stores ESC setpoint voltage, and the offset and slope generated from the calibration curve generator 220. The ESC setpoint voltage is determined beforehand and may be input by a user or programmed into the computer 228. The computer 228 is coupled to transmit the ESC setpoint voltage, the slope and offset to the voltage adjusting circuitry 232. The use of the computer 228 allows a user to input the parameters ESC setpoint voltage, slope and offset. This allows software manipulation of the bias compensation. Even though a computer is used in the preferred embodiment, it should be recognized that a storage element (e.g., RAM, DRAM, hard disk, etc.) for storing the ESC setpoint voltage, slope and offset may be used instead. This arrangement will be simpler than the computer, but will provide less flexibility in manipulating the bias compensation process.

The plasma processing system 200 begins wafer processing by activating the bias compensation device 222, ESC power supply 216, and RF power supply 218. In addition, the shower head 212 releases gas into the plasma region 226 of the chamber 202. The voltage adjusting circuitry 232 receives Vref, slope, and offset and generates an adjusted voltage Vadj in accordance with equation Vadj= [(Vref*slope)+offset]. Optionally, the voltage adjsuting circuitry may also generate Vsum by adding Vadj with the ESC setpoint voltage. The adjusted voltage Vadj and Vsum may then be transmitted to the ESC power supply 216, which converts the adjusted voltage back to corresponding high voltage level. Specifically, the ESC power supply 216 converts Vadj into bias compensation voltage, which is supplied to the ESC. Similarly, the ESC power supply 216 also may convert the Vsum into its corresponding high voltage and transmit it to the ESC.

By thus monitoring Vpp continuously, the bias compensation device 222 dynamically compensates for the bias of the wafer 234 without directly measuring the bias voltage. Even though the calibration curve generator 220 and the bias compensation device 222 are described in conjunction with a monopolar ESC, it should be appreciated that they may be used with any suitable type of monopolar and/or bipolar ESC to compensate for self-bias of wafers.

Figure 3:
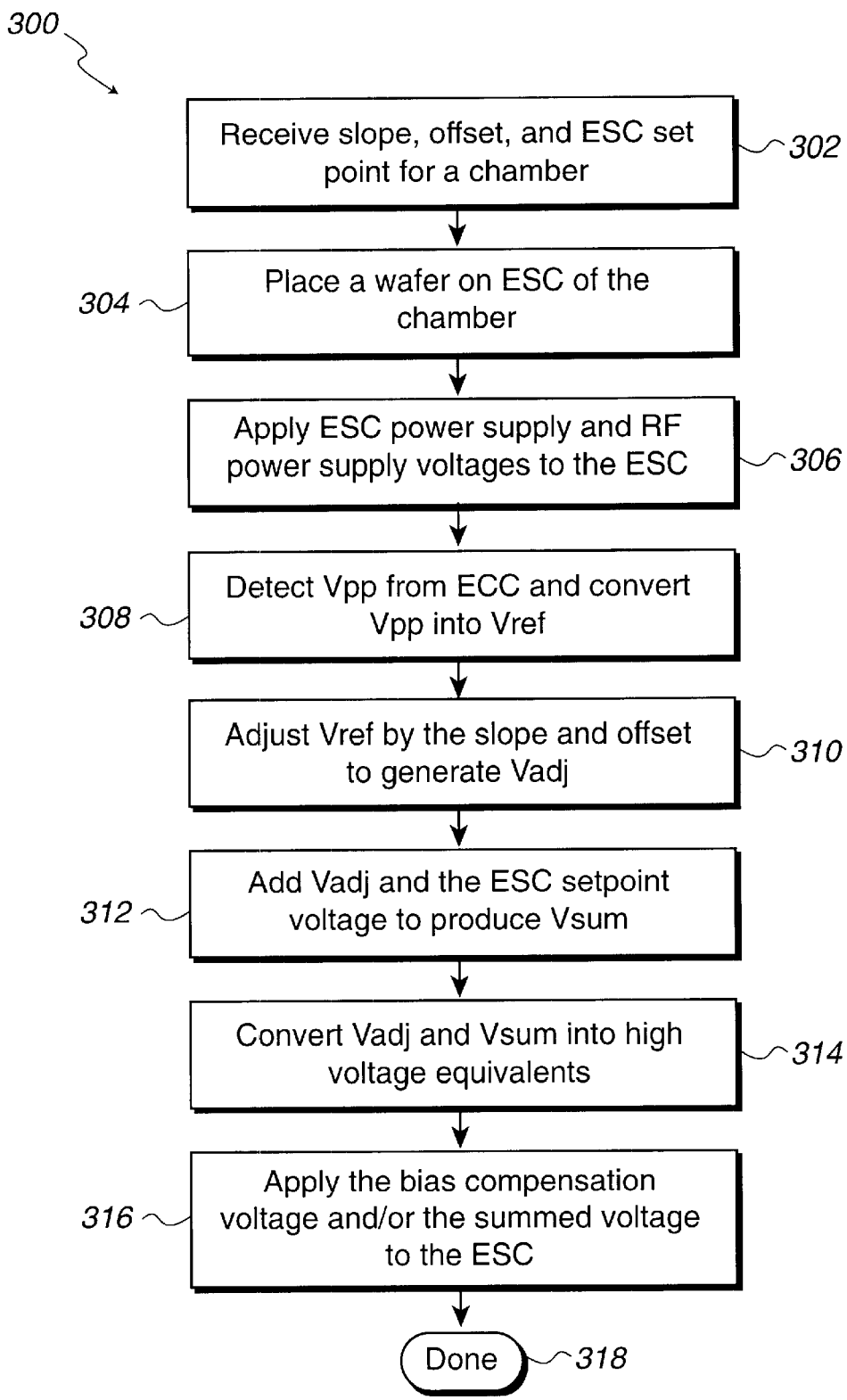
FIG. 3 shows a flow diagram of an exemplary method for compensating the bias of a wafer in a plasma processing system after determining a slope and an offset from a sample wafer.

FIG. 3 shows a flow diagram of a method 300 for compensating the bias of a wafer in a plasma processing system after determining a slope and an offset from a sample wafer. In operation 302, the ESC setpoint voltage, and the slope and offset from a calibration curve for a plasma processing chamber are received. Then in operation 304, a wafer is placed on an electrostatic chuck in the plasma processing chamber. The plasma processing system is then activated by applying ESC power supply and RF power supply voltages in operation 306. At this time or soon thereafter, a gas is released into the chamber for processing the wafer.

After the activation of the plasma processing system, Vpp from the ESC electrode is detected and converted into a lower voltage Vref in operation 308. The Vref is then adjusted by the slope and offset to generate Vadj in operation 310. Optionally, Vadj may be added to the ESC setpoint voltage produce Vsum in operation 312 for application in an isolated electrode, for example, in a monopolar ESC. Then in operation 314, Vadj and Vsum are converted to high voltages. Specifically, Vadj is converted to a bias compensation voltage while Vsum is converted to the sum of the bias compensation voltage and the ESC setpoint voltage. These high voltages are then applied to the ESC.

Figure 4:
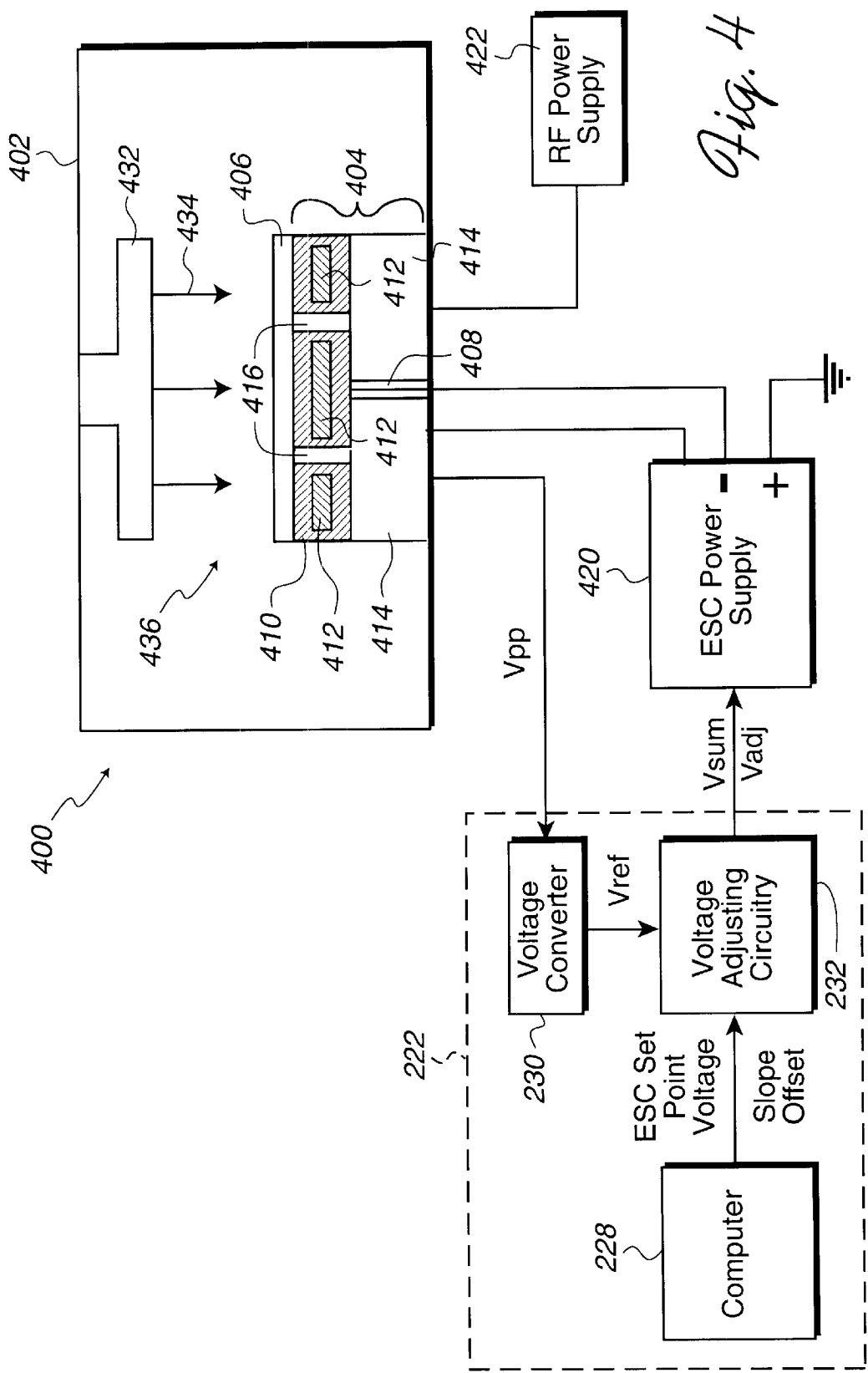
FIG. 4 illustrates a plasma processing system having a monopolar electrostatic chuck with an isolated electrode in accordance with one embodiment of the present invention.

The bias compensation technique can also be used in other types of monopolar and bipolar ESC configurations. For example, FIG. 4 illustrates a plasma processing system 400 having a monopolar electrostatic chuck 404 with an isolated electrode in accordance with another embodiment of the present invention. The plasma processing system 400 is otherwise identical to and operates in a similar manner as the plasma processing system 200.

The plasma processing system 400 includes a plasma processing chamber 402, an ESC power supply 420, and an RF power supply 422. The plasma processing system 400 is coupled to the bias compensation device 222. The monopolar electrostatic chuck 404 includes a dielectric layer 410 disposed over a metal layer 414. The dielectric layer 410 includes an isolated electrode 412 embedded within.

The chamber 402 includes a shower head 432 for injecting a gas 434 into a plasma region 436 of the chamber 402. A wafer is disposed over the electrostatic chuck 404. A plurality of feed tubes 416 and 418 are formed in the electrostatic chuck 404 to supply cooling gas such as helium to the wafer to cool the wafer 406 during plasma processing.

When activated, the bias compensating device 222 functions to generate Vadj and Vsum. Specifically, the voltage converter 230 detects Vpp from the metal layer 414 of the ESC 404 and converts the detected high voltage Vpp into a reduced voltage Vref for adjustment. The reduced voltage Vref is then fed into the voltage adjusting circuitry 232, which adjusts Vref in combination with ESC setpoint voltage, slope, and offset received from the computer 228 to generate Vadj and Vsum.

The generated Vadj and Vsum are then transmitted to the ESC power supply 420, which converts Vadj and Vsum into high power bias compensating voltage and the sum of the bias compensating voltage and the ESC setpoint voltage, respectively. The ESC power supply 420 is coupled to provide a bias compensating voltage to the electrode 414. In addition, the ESC power supply 420 supplies the sum of the bias compensating voltage and the ESC setpoint voltage to the metal layer 412 of the ESC 404.

The supply of the sum of the bias compensating voltage and the ESC setpoint voltage to the electrode 412 in the dielectric layer 410 to prevent electrode breakdown that may occur due to a potentially large DC bias difference between the wafer 406 and the ESC 404. The supply of the summed voltage prevents such breakdown by reducing the potential difference between the wafer 406 and the ESC 404. The bias compensating voltage is provided to the metal layer 404 to compensate for the bias of the wafer 406.

FIG. 5 shows a plasma processing system 500 having a bipolar electrostatic chuck 504. The calibration curve for the bipolar ESC configuration is generated in a similar manner as the monopole ESC configuration by measuring Vpp from one of the poles in the bipolar ESC. This means that, during bias compensation process, Vpp will be measured from the same pole from which the calibration curve was generated.

The plasma processing system 500 includes a plasma processing chamber 502, an ESC power supply 518, and an RF power supply 520. The bipolar ESC 504 includes a dielectric layer 508 disposed over a metal layer 506. The metal layer is divided into two portions to form two poles: a first metal portion forming a negative pole 510 and a second metal portion forming a positive pole. A wafer 506 to be processed is disposed over the bipolar ESC 504.

The plasma processing system is activated when the ESC and RF power supplies 518 and 520 are turned on and a gas 516 is released into the chamber 502. A shower head 514 in the chamber 502 injects the gas 516 into a plasma region 517 in the chamber 502. A feed-tube is provided within the ESC 504 to provide a cooling gas such as helium to cool the wafer 506 during plasma process.

Upon activation, the bias compensating device 522 functions to generate Vadj and includes a voltage converter 526, computer 526, and a voltage adjusting circuitry 528. More specifically, the voltage converter 526 detects Vpp from the pole 510 and converts the detected high voltage into a reduced voltage Vref for adjustment. The computer 524 stores and transmits ESC setpoint voltage, and the slope and offset determined from a calibration curve to the voltage adjusting circuitry 528. The adjusting circuitry 528 is coupled to the voltage converter to receive Vref and adjusts the Vref by the slope and offset to generate Vadj. The voltage adjusting circuitry 528 then transmits Vadj to a junction coupling a pair of resistors R1 and R2. The other terminals of the resistors are coupled to the negative and positive terminals of the ESC power supply 518, respectively. The resistors R1 and R2 are preferably matching resistors and function to center negative and positive voltages provided to the ESC 504 around Vadj.

The present invention thus provides devices, method, and system for efficiently compensating for self-bias of wafers placed over an electrostatic chuck for plasma processing without directly measuring the self-bias of the wafers. Instead, the present invention correlates the bias voltages of a sample wafer to the electrostatic chuck voltages to generate a calibration curve. A slope and an offset generated from the calibration curve is used to modify the supply voltage to the electrostatic chuck, thereby compensating for a wafer bias without contacting the wafer during processing. This allows dynamic compensation of wafer bias voltages, which may vary during the process without damaging the electrostatic chuck.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A bias compensation device for compensating a bias voltage on a wafer disposed in place over an electrostatic chuck in a processing chamber of a plasma processing system, the plasma processing system including an electrostatic and RF power supplies that are coupled to the electrostatic chuck, the bias compensation device comprising:

a voltage converter coupled to the electrostatic chuck for detecting a voltage Vpp of the electrostatic chuck, the voltage converter converting the detected voltage to a lower voltage Vref;

a storage unit for storing a predetermined slope and a predetermined offset of a calibration curve, the calibration curve derived by fitting a plurality of wafer bias voltages as a function of electrostatic chuck voltages from a test wafer; and a voltage adjusting circuitry coupled to receive Vref from the voltage converter, the voltage adjusting circuitry also being coupled to receive the slope and the offset from the storage unit such that the voltage adjusting circuitry modifies Vref by the slope and the offset to compensate for the bias voltage, the voltage adjusting circuitry transmitting the modified Vref to the electrostatic chuck power supply, which converts the modified Vref into a bias compensated voltage for input to the electrostatic chuck so as to substantially compensate for the bias voltage on the wafer.

2. The device as recited in claim 1, wherein the storage unit stores an electrostatic offset voltage for transmission to the voltage adjusting circuitry, wherein the voltage adjusting circuitry generates a voltage sum of the modified Vref and the electrostatic offset voltage.

3. The device as recited in claim 1, wherein the electrostatic chuck includes a dielectric layer disposed over a metal layer, wherein the bias compensated voltage is provided to the metal layer of the electrostatic chuck.

4. The device as recited in claim 2, wherein the electrostatic chuck includes a dielectric layer disposed over a metal layer, wherein the bias compensated voltage is provided to the metal layer of the electrostatic chuck.

5. The device as recited in claim 4, wherein the dielectric layer includes an electrode therein, wherein the voltage adjusting circuitry transmits the voltage sum to the electrode in the dielectric layer so as to reduce a potential difference between the wafer and the electrode.

6. The device as recited in claim 1, further comprising:

a calibration curve generator coupled to a sample wafer and the metal layer of the electrostatic chuck for measuring the bias voltages of the sample wafer and Vpp of the metal layer in a vacuum condition, one bias voltage for each Vpp, wherein the calibration curve generator generates the calibration curve by fitting the measured bias voltages and Vpp.

7. The device as recited in claim 6, wherein the calibration curve determines the offset by computing a voltage at an intersection of the calibration curve with an axis associated with the bias voltages.

8. The device as recited in claim 6, wherein the slope is determined from a pair of points on the calibration curve.

9. The device as recited in claim 1, wherein the voltage adjusting circuitry modifies Vref by first multiplying the slope to produce a product and then adding the offset to the product.

10. The device as recited in claim 1, wherein the electrostatic chuck is a monopolar chuck.

11. The device as recited in claim 1, wherein the electrostatic chuck is a bipolar chuck.

12. The device as recited in claim 2, wherein the storage unit is included in a computer such that the electrostatic chuck set point, and the slope and the offset capable of being changed by a user.

13. The device as recited in claim 2, wherein the storage unit is included in a computer such that the electrostatic chuck set point, and the slope and the offset capable of being programmed.

14. A plasma processing system for compensating a bias voltage on a wafer, the system comprising:
   a plasma processing chamber including: an electrostatic chuck having a dielectric layer disposed over a metal layer, the electrostatic chuck capable of supporting a wafer; and
   a shower head for releasing a gas into the chamber;
   an electrostatic power supply coupled to the electrostatic chuck for providing a high DC voltage to the electrostatic chuck;
   an RF power supply coupled to the electrostatic chuck for providing an RF voltage signal to the electrostatic chuck; and
   a bias voltage compensation device coupled between the metal portion of the electrostatic chuck and the electrostatic power supply to detect a voltage Vpp of the metal portion to generate a lower voltage Vref, the bias voltage compensation device adjusting Vref to generate an adjusted voltage Vadj using a calibration curve derived by fitting a plurality of wafer bias voltages as a function of electrostatic chuck voltages from a test wafer,
   wherein the electrostatic power supply receives the adjusted voltage Vadj and converts the adjusted voltage Vadj into a bias compensated voltage for input to the electrostatic chuck power supply to compensate for the bias voltage on the wafer.

15. The system as recited in claim 14, wherein the bias compensation device further comprises:
   a voltage converter coupled to the metal layer of the electrostatic chuck for detecting Vpp, the voltage converter converting the detected voltage to Vref;
   a storage unit for storing a predetermined slope and a predetermined offset of the calibration curve; and
   a voltage adjusting circuitry coupled to receive Vref from the voltage converter, the voltage adjusting circuitry also being coupled to receive the slope and the offset from the storage unit such that the voltage adjusting circuitry modifies Vref by the slope and the offset to compensate for the bias voltage, the voltage adjusting circuitry transmitting the modified Vref to the electrostatic chuck power supply, which converts the modified Vref into a bias compensated voltage for input to the electrostatic chuck.

16. The system as recited in claim 14, wherein the storage unit stores an electrostatic offset voltage for transmission to the voltage adjusting circuitry, wherein the voltage adjusting circuitry generates a voltage sum of the modified Vref and the electrostatic offset voltage.

17. The system as recited in claim 15, wherein the bias compensated voltage is provided to the metal layer of the electrostatic chuck.

18. The system as recited in claim 14, wherein the dielectric layer includes an electrode therein, wherein the voltage adjusting circuitry transmits the voltage sum to the electrode in the dielectric layer so as to reduce a potential difference between the wafer and the electrode.

19. The system as recited in claim 15, further comprising:
   a calibration curve generator coupled to a sample wafer and the metal layer of the electrostatic chuck for measuring the bias voltages of the sample wafer and Vpp of the metal layer in a vacuum condition, one bias voltage for each Vpp, wherein the calibration curve generator generates the calibration curve by fitting the measured bias voltages and Vpp.

20. The system as recited in claim 19, wherein the calibration curve determines the offset by computing a voltage at an intersection of the calibration curve with an axis associated with the bias voltages.

21. The system as recited in claim 19, wherein the slope is determined from a pair of points on the calibration curve.

22. The system as recited in claim 15, wherein the voltage adjusting circuitry modifies Vref by first multiplying the slope to produce a product and then adding the offset to the product.

23. The system as recited in claim 15, wherein the electrostatic chuck is a monopolar chuck.

24. The system as recited in clam 15, wherein the electrostatic chuck is a bipolar chuck.

25. A bias compensation device for compensating a bias voltage on a wafer disposed in place over an electrostatic chuck in a processing chamber of a plasma processing system, the plasma processing system including an electrostatic and RF power supplies that are coupled to the electrostatic chuck, the bias compensation device comprising:
   means for determining a slope and an offset of a calibration curve, the calibration curve being derived by fitting a plurality of wafer bias voltages as a function of electrostatic chuck voltages from a test wafer;
   means for detecting a voltage Vpp of the electrostatic chuck; means for converting the detected voltage to a lower voltage Vref;
   means for modifying Vref by the slope and the offset to compensate for the bias voltage; and means for converting the modified Vref into a bias compensated voltage for input to the electrostatic chuck to compensate for the bias voltage on the wafer.

26. The device as recited in claim 25, further comprising:
   means for determining an electrostatic offset voltage for transmission to the voltage adjusting circuitry; and
   means for adding the modified Vref and the electrostatic offset voltage to generate a voltage sum.

27. The device as recited in claim 25, wherein the electrostatic chuck includes a dielectric layer disposed over a metal layer, wherein the bias compensated voltage is provided to the metal layer of the electrostatic chuck.

28. The device as recited in claim 26, wherein the electrostatic chuck includes a dielectric layer disposed over a metal layer, wherein the bias compensated voltage is provided to the metal layer of the electrostatic chuck.

29. The device as recited in claim 28, wherein the dielectric layer includes an electrode therein, wherein the voltage sum is provided to the electrode in the dielectric layer so as to reduce a potential difference between the wafer and the electrode.

30. The device as recited in claim 25, wherein the calibration curve is derived by:
   providing an electrical contact to a sample wafer placed over the electrostatic chuck;

measuring the bias voltages of the sample wafer and Vpp of the metal layer in a vacuum condition, one bias voltage for each Vpp; and generating the calibration curve by fitting the measured bias voltages and Vpp.

31. The device as recited in claim 30, wherein the offset is determined from the calibration curve by computing a voltage at an intersection of the calibration curve with an axis associated with the bias voltages.

32. The device as recited in claim 25, wherein Vref is modified by first multiplying the slope to produce a product and then adding the offset to the product.

* * * * *